United States Patent
Wallace

(10) Patent No.: US 6,770,169 B1
(45) Date of Patent: Aug. 3, 2004

(54) CURED UREA FORMALDEHYDE RESIN-BOUND GLASS FIBER MATS

(75) Inventor: Karen L. Wallace, Midland, MI (US)

(73) Assignee: Dow Reichhold Specialty Latex LLC, Durham, NC (US)

( * ) Notice: Subject to any disclaimer, the term of this patent is extended or adjusted under 35 U.S.C. 154(b) by 114 days.

(21) Appl. No.: 09/801,998

(22) Filed: Mar. 8, 2001

Related U.S. Application Data

(60) Provisional application No. 60/187,963, filed on Mar. 9, 2000.

(51) Int. Cl.$^7$ .......................... D21H 13/40; D21H 17/33
(52) U.S. Cl. .................... 162/156; 162/164.1; 162/166; 162/167; 162/168.1; 524/216; 524/512; 525/518
(58) Field of Search ............................ 524/512, 9, 216; 525/518; 162/166, 164.1, 145, 156, 168.1, 167

(56) References Cited

U.S. PATENT DOCUMENTS

| | | | | |
|---|---|---|---|---|
| 3,030,325 A | * | 4/1962 | Scopp ....................... 260/29.4 |
| 3,650,805 A | * | 3/1972 | Imoto et al. ................ 117/62.2 |
| 3,769,143 A | * | 10/1973 | Kulesza ....................... 161/156 |
| 3,883,463 A | * | 5/1975 | Jin et al. ................ 260/29.4 R |
| 4,430,158 A | | 2/1984 | Jackey et al. ............... 162/156 |
| 5,334,648 A | | 8/1994 | Drews et al. ................ 524/512 |
| 5,389,716 A | * | 2/1995 | Graves ........................ 524/510 |
| 5,445,878 A | | 8/1995 | Mirous ........................ 428/288 |
| 5,518,586 A | | 5/1996 | Mirous ........................ 162/156 |
| 5,594,061 A | | 1/1997 | Sharma et al. .............. 524/503 |
| 5,656,366 A | | 8/1997 | Mirous ........................ 442/327 |
| 5,721,309 A | | 2/1998 | Sharma et al. .............. 524/506 |
| 5,977,242 A | | 11/1999 | Origuchi et al. ............ 524/521 |

FOREIGN PATENT DOCUMENTS

EP 0599295 A 6/1994

* cited by examiner

*Primary Examiner*—Peter Chin
(74) *Attorney, Agent, or Firm*—Myers Bigel Sibley & Sajovec, PA

(57) ABSTRACT

A method for improving the balance of tensile strength and tear strength of cured urea formaldehyde (UF) resin-bound glass fiber nonwoven mats; the glass fiber nonwoven mats produced by the method, and a phosphate-containing binder composition useful in the method. The mats are useful in, for example, the manufacture of roofing shingles.

7 Claims, No Drawings

CURED UREA FORMALDEHYDE RESIN-BOUND GLASS FIBER MATS

CROSS-REFERENCE TO PRIOR APPLICATION

This application claims the benefit under 35 USC 119(e) of provisional application serial No. 60/187,963 filed Mar. 9, 2000.

BACKGROUND OF THE INVENTION

The present invention relates to glass fiber mats and a process for their production.

Glass fiber mats are composed of glass fibers held together by a binder material. These mats are commonly used in the production of asphalt-containing roofing shingles. A problem with current glass mat manufacturing technology is that the glass mats exhibit a poor balance of tensile strength and tear strength. Although it is known how to increase either tear or tensile strength individually, a formulation or process change made to increase one of these properties will simultaneously decrease the other. Commercial manufacturers of glass fiber mats have long felt a need to have a glass fiber mat in which this balance of properties is improved.

U.S. Pat. No. 4,430,158 (Jackey et al.) discloses a method of preparing a glass fiber mat having improved wet tensile strength by using a binder composition containing a urea formaldehyde resin and 0.01–5 percent of a water-soluble, anionic surfactant, said surfactant having a hydrophobic segment of 8–30 carbon atoms and an anionic segment selected from among carboxy, sulfate ester, phosphate ester, sulfonic acid and phosphonic acid groups. Jackey states that using his binder in an amine oxide white water system gives glass mats that retain up to 79 percent of their dry tensile strength under wet conditions.

U.S. Pat. No. 4,917,764 (Lalwani et al.) discloses that glass fiber mats having improved strength and fiber wetability can be prepared by incorporating 1–6 percent of certain carboxylated styrene butadiene latexes into a urea formaldehyde resin solution and using that solution as a binder.

U.S. Pat. No. 5,518,586 (Mirous) discloses preparation of glass mats using a binder comprising a urea formaldehyde resin plus a water-insoluble anionic phosphate ester in a hydroxyethyl cellulose white water system. Mirous states that Jackey's system gives no improvement in tear strength. Mirous also states that when glass fibers are dispersed in white water containing a polyacrylamide viscosity modifier, high mat tear strengths have been achieved with latex fortification of urea formaldehyde resins.

As a matter of commercial reality, despite the wealth of information in the prior art, glass mat manufacturers desire an affordable binder system that would give increased tear strength and a good balance of tear strength and tensile strength. Current commercially available binder systems do not meet these criteria; they provide satisfactory tear or tensile strength, but not both.

SUMMARY OF THE INVENTION

This invention relates to a method for improving the balance of tensile strength and tear strength of cured, latex-modified urea formaldehyde (UF) resin-bound glass fiber nonwoven mats. The invention is also directed to the glass fiber nonwoven mats produced by the method, and to the binder composition used in the method. The mats are useful in, for example, the manufacture of roofing shingles.

In one aspect the invention is a process for preparing a glass fiber mat, the process comprising: (a) forming a wet glass fiber mat; (b) applying to the wet glass fiber mat a binding amount of a binder comprising: a urea formaldehyde resin, 0.5–15% by weight of a latex, based on the dry weight of the urea formaldehyde resin and the latex, and 0.5–15% by weight, based on the dry weight of the latex solids, of a salt or free acid of an anionic organic phosphate ester surfactant; and (c) curing the binder.

The invention also includes a binder composition comprising a urea formaldehyde resin and 0.5–15% of an emulsion polymer, based on the dry weight of the urea formaldehyde resin and the emulsion polymer, and 0.5–15%, based on the dry weight of the emulsion polymer solids, of a salt or free acid of an anionic organic phosphate ester surfactant. In another aspect, the invention includes a binder composition comprising: (a) a urea formaldehyde resin; (b) 0.5–15% by weight of an emulsion polymer, based on the dry weight of the urea formaldehyde resin and the emulsion polymer, the emulsion polymer containing phosphorus in its polymer molecule as 0.1 to 10% by weight of the polymerized residue of an anionic phosphate group-containing monomer, or from 0.1 to 2 weight percent of the polymerized residue of a perphosphate initiator, or a combination of these, based on the solids of the emulsion polymer; and (c) optionally 0.5–15% by weight, based on the dry weight of the emulsion polymer solids, of a salt or free acid of an organic phosphate ester surfactant. The mat produced using the binder of the invention is also part of the invention.

The present invention enables production of a glass fiber nonwoven mat with a surprisingly improved balance of dry tensile strength and tear strength.

DETAILED DESCRIPTION OF THE INVENTION

The method of the invention employs a binder and glass fibers.

The binder of the invention comprises a UF resin, an emulsion polymer, and a molecule containing a phosphate moiety. The emulsion polymer may also be the molecule containing the phosphate moiety. The molecule containing a phosphate moiety can be incorporated into the binder in several ways. For example, it can be in the aqueous emulsion polymer in the form of a surfactant that is in the reaction mixture when the emulsion polymer is prepared, or it can be in the form of a reactive surfactant that is in the reaction mixture when the emulsion polymer is prepared, or it can be in the form of a perphosphate initiator used when the emulsion polymer is prepared, or it can be added as a surfactant during the formulation of the UF resin, the emulsion polymer or the binder. The phosphate moiety-containing molecule can be incorporated into the binder using any combination of these techniques. For example, the binder may comprise both a surfactant and an emulsion polymer prepared using at least one phosphate group-containing surfactant monomer or perphosphate initiator.

Urea formaldehyde resins are well known and widely commercially available. Examples of commercially available urea formaldehyde resins include CASCO-RESIN C-802B and CASCO-RESIN 520HT, which are available from Borden, Inc. Mixtures of UF resins can be employed. The UF resin is employed in an amount sufficient to provide structural integrity both to the glass mat during processing into a shingle and to the shingle itself. The UF resin suitably is from about 85 to 99.5 weight percent of the binder, based on the dry weight of the UF resin and emulsion polymer in the binder, preferably is from about 88 to about 95 weight percent of the binder, and most preferably is from about 89 to about 93 weight percent of the binder.

Emulsion polymers, such as carboxylated styrene butadiene latexes, are well known and widely commercially available. The emulsion polymers employed in the present invention are copolymers prepared from emulsion polymerization of a monomer mixture comprising at least one of the following: styrene or one or more substituted styrenes; a diene such as butadiene or one or more substituted dienes; vinyl esters such as vinyl propionate, vinyl acetate and isopropenyl acetate; (meth)acrylic esters such as methyl acrylate, ethyl acrylate, butyl acrylate, 2-ethylhexyl acrylate and methyl methacrylate; vinyl chloride; acrylonitrile or methacrylonitrile; and the like. Also included are functional monomers such as ethylenically unsaturated carboxylic acid monomers, for example, acrylic acid, methacrylic acid, itaconic acid, fumaric acid and the like; and acrylamide or substituted acrylamides. Copolymers of styrene, butadiene, and a carboxylic acid monomer, optionally including-a phosphate-group-containing surfactant monomer, are preferred. Methods of preparing emulsion polymers are well-known to those skilled in the art. Mixtures of emulsion polymers can be employed.

In one embodiment of the invention, the monomer mixture can include a phosphate group-containing polymerizable surfactant monomer such as, for example the phosphate ester of 2-hydroxyethyl methacrylate, which is commercially available as T MULZ 1228 from Harcros Chemicals Inc. In another embodiment of the invention, a perphosphate initiator is employed to prepare the emulsion polymer. When a phosphate group-containing monomer, or perphosphate initiator, or a combination of these, is employed in the preparation of the polymer, it is employed in an amount sufficient to improve the balance of tear strength and tensile strength of a bonded nonwoven glass mat prepared using an emulsion polymer that was polymerized using the phosphate monomer, the perphosphate initiator, or a combination of these, as compared to the balance of tear strength and tensile strength of a bonded nonwoven mat prepared without using the phosphate monomer or the perphosphate initiator. Preferably, the amount of phosphate-containing monomer employed is from about 0.1 to about 10 weight percent, based on the dry weight of the emulsion polymer employed in the binder. More preferably, the amount of phosphate-containing monomer employed is from about 0.5 to about 7.5 weight percent, and most preferably is from about 1 to about 5 weight percent. The amount of perphosphate initiator employed is preferably from about 0.1 to about 2 weight percent, based on the dry weight of the emulsion polymer employed in the binder. More preferably, the amount of perphosphate initiator employed is from about 0.2 to about 1.5 weight percent, and most preferably is from about 0.5 to about 1 weight percent.

The emulsion polymer is employed in an amount sufficient to enhance binder processability and sufficient to enhance the properties of the bonded nonwoven glass mat as described above. Preferably, the amount of emulsion polymer employed is from about 0.5 to about 15 weight percent based on the dry weight of the urea formaldehyde resin and emulsion polymer. More preferably, the amount of emulsion polymer employed is from about 5 to about 12 weight percent, and most preferably is from about 7 to about 11 weight percent.

An organic, anionic, phosphate ester surfactant is employed in certain embodiments of the invention. The surfactant suitably is a salt or free acid of an anionic organic phosphate ester. If the free acid is employed, it can be solubilized in water as a salt. Many examples of these surfactants are commercially available. Examples of commercially available anionic phosphate ester surfactants include RHODAFAC RE-610 and RHODAFAC BX-660, which are available from Rhone Poulenc. Water-soluble surfactants are preferred. The hydrophobe of the surfactant can be aliphatic or aromatic, with aliphatic being preferred. A preferred surfactant has a polyethyleneoxy segment of from about 3 to about 15 ethyleneoxy units, and more preferably from 4 to 12 units, and most preferably from 5 to 10 units. Mixtures of surfactants can be employed.

The surfactant is employed in an amount sufficient to improve the balance of tear strength and tensile strength of a bonded nonwoven glass mat prepared using the surfactant, as compared to the balance of tear strength and tensile strength of a bonded nonwoven prepared without using the surfactant. Preferably, the amount of surfactant employed is from about 0.5 to about 15 weight percent, based on the dry weight of the emulsion polymer employed in the binder. More preferably, the amount of surfactant employed is from about 0.75 to about 10 weight percent, and most preferably is from about 1 to about 5 weight percent.

It is possible to employ any combination of phosphate group-containing monomer, perphosphate initiator, and anionic organic phosphate ester surfactant. When a phosphate group-containing monomer or perphosphate initiator is employed in the preparation of the polymer, the use of a phosphate ester surfactant is optional. When a phosphate group-containing monomer or perphosphate initiator is not employed in the preparation of the polymer, the phosphate ester surfactant is required. When a combination of these materials are employed, the components are employed in amounts sufficient to achieve the desired improved balance of tear and tensile strength.

The binder is prepared by mixing its components using well-known mixing techniques such that a homogeneous binder is employed. The order of blending of the components is not critical. The components of the binder may be individually premixed in any order and in any combination. For example, the phosphate ester surfactant may be post-added to the emulsion polymer or to the UF resin. In addition, the phosphate ester surfactant can be added during the polymerization of the emulsion polymer to stabilize the polymer particles.

The binder may also contain conventional additives such as, for example, pigments, fillers, anti-migration aids, curing agents, neutralizers, coalescents, wetting agents, biocides, plasticizers, organosilanes, anti-foaming agents, colorants, waxes and anti-oxidants. The binder may be applied to a glass fiber nonwoven by conventional techniques such as, for example, air or airless spraying, padding, saturating, roll coating, curtain coating, beater deposition, coagulation and the like. The amount of binder employed in the preparation of a bonded glass fiber mat is from 10–35% LOI (loss on ignition). Preferably, the amount of binder is from about 15 to about 25% LOI, and most preferably is from about 18 to about 22%.

Procedures for preparing glass fiber nonwoven mats, and the fibers used in the preparation process, are well known to those skilled in the art. Glass fiber shingle mat is commercially available from several manufacturers. The glass fiber nonwoven mat may be prepared from fibers of various length which may have been previously subjected to various treatment or primer steps. The glass fiber nonwoven can be of various thicknesses as appropriate for the desired end use and can be formed by a wet laid or dry laid process. The glass fiber nonwoven may contain fibers other than glass, for example aramid fibers, ceramic fibers, metal fibers, carbon fibers, polyimide fibers, polyester fibers and rayon fibers, in so far as they do not adversely affect the performance of the nonwoven mat.

The aqueous binder, after it is applied to a glass fiber nonwoven mat, is heated to effect drying and curing. Heat treatment at about 120° C. to about 400° C. for a period of time of from about 3 seconds to about 15 minutes may be carried out; treatment at about 150° C. to about 200° C. is preferred. The drying and curing functions may be effected in two or more distinct steps, if desired.

The cured glass fiber nonwoven mats may be used for applications such as, for example, roofing mats, insulation batts or rolls, reinforcing mat for flooring applications, roving, microglass-based substrate for printed circuit boards or battery separators, filter stock, tape stock, and reinforcement scrim in cementitious and non-cementitious coatings for masonry.

The present invention provides a glass fiber nonwoven mat with a surprisingly improved balance of dry tensile strength and tear strength relative to a glass fiber nonwoven mat that is prepared using a control binder, not of the invention.

Specific Embodiments of the Invention

The following examples and comparative experiments are given to illustrate the invention and should not be construed as limiting its scope. All parts and percentages are by weight unless otherwise indicated.

Glass Mat Preparation Procedure

This procedure is employed to prepare the mats used in the examples that follow. Glass fiber nonwoven handsheets are prepared with Owens Corning 9501, ¾ inch length, sized glass chop using approximately 6.4 grams of glass fiber per sheet (2.0 pounds per 100 square feet). The glass fiber is dispersed in water using MAGNIFLOC 1885A (American Cyanamid Company), an anionic polyacrylamide water-in-oil emulsion, and RHODAMEEN VP-532 SPB dispersant (Rhone-Poulenc Chemical Company). Handsheets are formed in a Williams handsheet mold. The wet sheet is transferred to a vacuum station and de-watered. An aqueous admixture with a UF/latex blend weight ratio of 9:1, at 20% solids, i.e. 9 weight parts UF resin solids per 1 part latex solids in 40 parts of water, is prepared and applied to the de-watered sheet and the excess is vacuumed off. The sheets are dried/cured in a forced air oven for 3 minutes at 205° C. The binder amount on the samples is 20% LOI.

All tensile values are in lbs/in. Wet tensiles are run after soaking the samples for 10 minutes in 82° C water. Samples are 2" by 5"; gap space is 2 inches; crosshead speed is 2 inches/minute.

Elmendorf tear strength is determined on 2.4375 inch by 3 inch samples. A single-ply sample is placed in a Thwing-Albert Tear Tester with a 1600 g tear arm. The sample is notched with a 0.75 inch cut and the arm is released. Tear strength is recorded in grams/ply.

EXAMPLE 1

Non-carboxylated S/B Latex DL460NA[1]

| Binder | Binder Composition |
|---|---|
| 1 | 100% CASCO-RESIN[2] C-802B |
| 2 | 90/10 Mixture of CASCO-RESIN[2] C-802B and Latex DL460NA[1] |
| 3 | 90/10 Mixture of CASCO-RESIN[2] C-802B and Latex DL460NA[1]; 10% RHODAFAC[3] BX-660 Phosphate Ester Surfactant Post-Added to Binder Mix (Active, by Weight based on latex solids) |
| 4 | 90/10 Mixture of CASCO-RESIN[2] 802B and Latex DL460NA[1]; 5% (Active, by Weight) RHODAFAC[3] BX-660 Phosphate Ester Surfactant Post-Added to Binder Mix |

| Binder | Tensile (lbs./inch) | Wet/Hot Tensile (lbs/inch) | % Retention | Tear Strength (g/ply) |
|---|---|---|---|---|
| 1* | 45 | 31.5 | 70 | 637 |
| 2* | 62.5 | 30 | 48 | 493 |
| 3 | 51.5 | 37.5 | 73 | 821 |
| 4 | 61.5 | 49 | 80 | 676 |

*Not an embodiment of the invention.

The four binders in Example 1 demonstrate the unexpected improvement in performance achieved through the addition of a phosphate ester surfactant. Blending latex with UF resin (compare Binders 1 and 2) improves dry tensile but hurts tear strength. The addition of 5 or 10% phosphate ester surfactant to Binder 2 (compare Binders 2, 3 and 4) gives an improved balance of tensile and tear strength, i.e., a dry tensile strength of greater than 50 lb./inch and a tear strength of greater than 500 g/ply.

EXAMPLE 2

Carboxylated S/B Latex CP615NA[1]

| Binder | Binder Composition |
|---|---|
| 5 | 90/10 Mixture of CASCO-RESIN[2] C-802B and Latex CP615NA[1] |
| 6 | 90/10 Mixture of CASCO-RESIN[2] C-802B and Latex CP615NA[1]; 5% (Active, by Weight) RHODAFAC[3] RS410 Phosphate Ester Surfactant Post-Added to Binder Mix |
| 7 | 90/10 Mixture of CASCO-RESIN[2] C-802B and Latex CP615NA[1]; 5% (Active, by Weight) RHODAFAC[3] RS610 Phosphate Ester Surfactant Post-Added to Binder Mix |
| 8 | 90/10 Mixture of CASCO-RESIN[2] C-802B and Latex CP615NA[1]; 5% (Active, by Weight) RHODAFAC[3] RS710 Phosphate Ester Surfactant Post-Added to Binder Mix |
| 9 | 90/10 Mixture of CASCO-RESIN[2] C-802B and Latex CP615NA[1]; 5% (Active, by Weight) RHODAFAC[3] BX-660 Phosphate Ester Surfactant Post-Added to Binder Mix |

| Binder | Tensile (lbs./inch) | Wet/Hot Tensile (lbs./inch) | % Retention | Tear Strength (g/ply) |
|---|---|---|---|---|
| 5* | 83 | 57.5 | 69 | 461 |
| 6 | 68 | 43.5 | 64 | 525 |
| 7 | 69.5 | 48.5 | 70 | 599 |
| 8 | 74.5 | 46.5 | 62 | 529 |
| 9 | 72.5 | 55.5 | 77 | 575 |

*Not an embodiment of the invention.

The five binders in Example 2 demonstrate the unexpected improvement in performance achieved through the addition of a variety of phosphate ester surfactants to a UF/latex binder mix. RHODAFAC RS410, 610 and 710 are aliphatic phosphate esters that differ in the number of polyethyleneoxy units in the hydrophile. The hydrophobe in RHODAFAC BX-G660 is octylphenol. The binders containing these phosphate ester surfactants demonstrate an improved balance of glass mat tensile and tear strength when compared to the properties obtained using a simple blend of UF resin and latex (Binder 5).

EXAMPLE 3

Non-carboxylated S/B Latex DL460NA[1] and Carboxylated S/B Latex DL490NA

| Binder | Binder Composition |
|---|---|
| 10 | 100% CASCO-RESIN[2] 520HT |
| 11 | 90/10 Mixture of CASCO-RESIN[2] 520HT and Latex DL490NA[1] |
| 12 | 90/10 Mixture of CASCO-RESIN[2] 520HT and Latex DL460NA[1]; 10% (Active, by Weight) RHODAFAC[3] BX-660 Phosphate Ester Surfactant Post-Added to Binder Mix |

| Binder | Tensile (lbs./inch) | Wet/Hot Tensile (lbs./inch) | % Retention | Tear Strength (g/ply) |
|---|---|---|---|---|
| 10* | 42.5 | 28.5 | 67 | 536 |
| 11* | 81.5 | 58.5 | 72 | 415 |
| 12 | 55.5 | 46 | 83 | 676 |

*Not an embodiment of the invention.

The binders described in Example 3 demonstrate the effect if adding a latex to a high-tear UF resin (compare Binders 10 and 11). Tensile improves markedly with the addition of 10% latex but tear strength is diminished. Addition of a phosphate ester surfactant to a high-tear UF resin/latex binder mix improves both tensile and tear strength (compare Binders 10 and 12).

EXAMPLE 4

Carboxylated S/B Latex CP615NA[1] Made With 2% Phosphate Ester Monomer

| Binder | Binder Composition |
|---|---|
| 13 | 90/10 Mixture of CASCO-RESIN[2] FG486 and Latex DL490NA[1] |
| 14 | 90/10 Mixture of CASCO-RESIN[2] FG486 and Latex CP615[1]-type made with 2 parts T MULZ 1228[4] |

| Binder | Tensile (lbs./inch) | Wet/Hot Tensile (lbs/inch) | % Retention | Tear Strength (g/ply) |
|---|---|---|---|---|
| 13* | 47.5 | 30 | 63 | 413 |
| 14 | 61 | 32 | 52 | 549 |

*Not an embodiment of the invention.

In Example 4, 2 parts of styrene monomer in carboxylated S/B Latex CP615 have been replaced with 2 parts of T MULZ 1228, the phosphate ester of 2-hydroxyethyl methacrylate. No phosphate ester surfactant is employed in the polymerization. The balance of glass mat tensile and tear strength properties is markedly and unexpectedly improved with the use of a phosphated monomer-containing latex compared to the use of a latex without the phosphate group-containing monomer.

1. Available from The Dow Chemical Company.
2. Available from Borden.
3. Available from Rhone-Poulenc.
4. Available from Harcros Chemicals Inc.

What is claimed is:

1. A binder composition comprising: (a) a urea formaldehyde resin; (b) 0.5–15% by weight of an emulsion polymer, based on the dry weight of the urea formaldehyde resin and the emulsion polymer, the emulsion polymer containing phosphorus in its polymer molecule as 0.1 to 10% by weight of the polymerized residue of an anionic phosphate group-containing monomer, or from 0.1 to 2 weight percent of the polymerized residue of a perphosphate initiator, or a combination of these, based on the solids of the emulsion polymer, and (c) optionally 0.5–15% by weight, based on the dry weight of the emulsion polymer solids, of a salt or free acid of an organic phosphate ester surfactant.

2. The binder of claim 1 wherein the amount of phosphate monomer residue is from 0.5 to 7.5 weight percent of the emulsion polymer.

3. The binder of claim 1 wherein the amount of perphosphate initiator residue is from 0.5 to 1 weight percent of the emulsion polymer.

4. The binder of claim 2 wherein the latex is a carboxylated styrene butadiene latex.

5. A binder composition comprising: a urea formaldehyde resin and 0.5–15% by weight of an emulsion polymer, based on the dry weight of the urea formaldehyde resin and the emulsion polymer, and 0.5–15% by weight, based on the dry weight of the emulsion polymer solids, of a salt or free acid of an anionic organic phosphate ester surfactant.

6. The binder of claim 5 wherein the amount of latex is from 3 to 12 percent, and the amount of surfactant is from 0.75 to 10 weight percent.

7. The binder of claim 6 wherein the surfactant has a polyethyleneoxy chain of from 3 to 15 units.

* * * * *